United States Patent
Silk et al.

(10) Patent No.: US 11,509,329 B2
(45) Date of Patent: Nov. 22, 2022

(54) COMPRESSION OF POWER SYSTEM SIGNALS

(71) Applicant: Schweitzer Engineering Laboratories, Inc., Pullman, WA (US)

(72) Inventors: Eric Andrew Silk, Moscow, ID (US); Peter S. LaDow, Lewiston, ID (US); Matthew J. Halladay, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 180 days.

(21) Appl. No.: 17/172,447

(22) Filed: Feb. 10, 2021

(65) Prior Publication Data

US 2022/0255557 A1 Aug. 11, 2022

(51) Int. Cl.
*H03M 7/00* (2006.01)
*H03M 7/40* (2006.01)
(Continued)

(52) U.S. Cl.
CPC ............ *H03M 7/40* (2013.01); *G05B 19/042* (2013.01); *H02J 3/0012* (2020.01);
(Continued)

(58) Field of Classification Search
CPC .... H03M 7/40; H02J 13/00002; H02J 3/0012; G05B 19/042; G01R 21/00; G01R 21/133
See application file for complete search history.

(56) References Cited

U.S. PATENT DOCUMENTS 8,880,368 B2 11/2014 Hewitt
9,324,122 B2 4/2016 Wright
(Continued)

FOREIGN PATENT DOCUMENTS

JP 2017049259 * 3/2017 ........... G01R 22/063

OTHER PUBLICATIONS

Brejza, Matthew F.; Wang, Tao; Zhang, Wenbo; Al-Khalili, David; Maunder, Robert; Al-Hashimi, Bashir; Hanzo, Lajos: "Exponential Golomb and Rice Error Correction Codes for Generalized Near-Capacity Joint Source and Channel Coding" IEEE Access, Jun. 24, 2016.

(Continued)

*Primary Examiner* — Joseph J Lauture
(74) *Attorney, Agent, or Firm* — Jared L. Cherry

(57) ABSTRACT

The present disclosure pertains to systems and methods to compress an input signal representing a parameter in an electric power system. In one embodiment, a system includes a data acquisition subsystem to receive an input signal comprising a plurality of high-speed representations of electrical conditions. A linear prediction subsystem generates an excitation signal estimate based on the input signal, a plurality of linear prediction coefficients based on the input signal, and an estimated signal based on the excitation signal estimate and the plurality of linear prediction coefficients. An error encoding subsystem may generate an encoding of an error signal based on a difference between the input signal and the estimated signal. A non-transitory computer-readable storage medium may store an encoded and compressed representation of the input signal comprising the excitation signal estimate, the plurality of linear prediction coefficients, and the encoding of the error signal.

23 Claims, 6 Drawing Sheets

(51) Int. Cl.
*G05B 19/042* (2006.01)
*H02J 3/00* (2006.01)
*H02J 13/00* (2006.01)
*H04B 3/54* (2006.01)
*G01R 21/133* (2006.01)
*G01R 21/00* (2006.01)

(52) U.S. Cl.
CPC ........ *H02J 13/00002* (2020.01); *G01R 21/00* (2013.01); *G01R 21/133* (2013.01); *G05B 2219/25252* (2013.01); *H04B 3/542* (2013.01)

(56) References Cited

U.S. PATENT DOCUMENTS

| | | | |
|---|---|---|---|
| 9,948,420 | B2 | 4/2018 | Wright |
| 10,664,553 | B2 | 5/2020 | Hewitt |
| 2006/0150224 | A1 | 7/2006 | Kamariotis |
| 2006/0259255 | A1 | 11/2006 | Anderson |
| 2013/0346419 | A1 | 12/2013 | Hewitt |
| 2014/0207017 | A1 | 7/2014 | Gilmore |
| 2015/0089027 | A1 | 3/2015 | Zweigle |
| 2018/0024203 | A1 | 1/2018 | Halladay |
| 2020/0274523 | A1 | 8/2020 | Halladay |

OTHER PUBLICATIONS

Gallager, Robert G; Van Voorhis, David C.: "Optimal Source Codes for Geometrically Distributed Integer Alphabets" IEEE Transactions on Information Theory, Mar. 1975.

Malvar, Henrique S. "Adaptive Run-Length / Golomb-Rice Encoding of Quantized Generalized Gaussian Sources with Unknown Statistics" Proceedings of the Data Compression Conference, Apr. 2006.

Ramirez, Miguel Arjona "A Levinson Algorithm Based on an Isometric Transformation of Durbin's" IEEE Signal Processing Letters, 2008.

Rice, Robert F; Plaunt, James R.: "Adaptive Variable-Length Coding for Efficient Compression of Spacecraft Television Data" IEEE Transactions on Communication Technology, Dec. 6, 1971.

Su, Tiankai; Yu, Cunxi; Yasin, Atif; Ciesielski, Maciej: "Formal Verification of Truncated Multipliers Using Algebraic Approach and Re-Synthesis" IEEE Computer Society Annual Symposium on VLSI, 2017.

SEL-5078-2 Synchrowave Central, available at: https://selinc.com/products/5078-2/ printed on Aug. 16, 2017.

SEL-5601-2 Synchrowave Event, available at: https://selinc.com/products/5601-2/ printed on Aug. 16, 2017.

\* cited by examiner

COMPRESSION OF POWER SYSTEM SIGNALS

TECHNICAL FIELD

The present disclosure pertains to encoding and compressing power system signals using linear prediction and an encoding of an error signal. More particularly, but not exclusively, the systems and methods disclosed herein may be used to compress data representing time-domain measurements of electrical parameters for archival and/or transmission.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
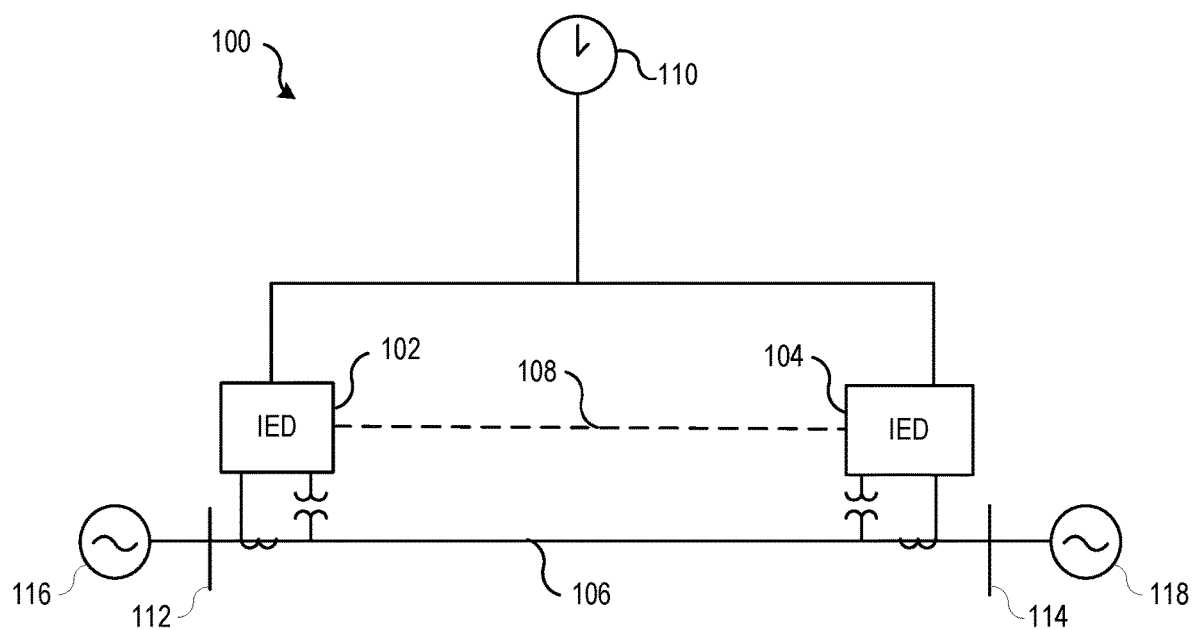
FIG. 1 illustrates a simplified one-line diagram of an electric power delivery system consistent with embodiments of the present disclosure.

High-speed monitoring of electric power systems provides improved power system stability because if faults are not cleared before a critical fault clearing time, the system may lose transient stability and possibly suffer a blackout. In addition, faster fault clearing increases the amount of power that can be transferred through a given system. Faster protection also enhances public and utility personnel safety, limits equipment wear, improves power quality, and reduces property damage.

High-speed protection devices respond to high-frequency signal components, which may be used to detect faults and to realize various advantages. For example, wind and solar power sources are connected to the power system through a power electronics interface and typically have little or no inertia. Their control algorithms protect the converters from fault conditions. As a result, these sources produce voltages and currents that challenge some protection principles developed for networks with synchronous generators. In contrast, high-speed protection devices configured to respond to high-frequency signal components are less dependent on the sources and more dependent on conditions in the electric power system. As a result, such relays may be useful in applications near nontraditional sources.

Further, high-speed monitoring may enable analysis of traveling waves (TWs) to aid in the detection of faults. When a fault occurs in an electric power system, traveling waves are launched from the fault and travel outward at a velocity near the speed of light. The traveling waves are reflected by buses and other discontinuities according to their corresponding characteristic impedances. In the initial stage of the fault, the electric power system may behave like a distributed parameter network. Accordingly, the traveling waves may be described by a propagation velocity, reflection and transmission coefficients, and a line characteristic impedance. Using a traveling wave detection algorithm, a high-speed relay may be able to detect a fault and initiate corrective action in less than 1 millisecond.

High-speed monitoring generates large quantities of data. The data can provide valuable information about the operation of electric power systems over time; however, the volume of data can make storage and transmission difficult. Devices that store such information may be located in substations distributed throughout an electric power system and may have limited connectivity due to security concerns.

The inventors of the present disclosure have recognized that certain advantages may be realized by utilizing linear prediction and an encoding of an error signal for compression of power system signals. Various embodiments consistent with the present disclosure may provide lossless compression of power system signals for storage, and therefore, may allow more information to be stored in a device of a given capacity. Further, various embodiments may compress information for transmission, thus allowing such data to be communicated more quickly and/or communicated over lower bandwidth channels.

As used herein, an IED may refer to any microprocessor-based device that monitors, controls, automates, and/or protects monitored equipment within a system. Such devices may include, for example, differential relays, distance relays, directional relays, feeder relays, overcurrent relays, voltage regulator controls, voltage relays, breaker failure relays, generator relays, motor relays, remote terminal units, automation controllers, bay controllers, meters, recloser controls, communication processors, computing platforms, programmable logic controllers (PLCs), programmable automation controllers, input and output modules, and the like. The term IED may be used to describe an individual IED or a system comprising multiple IEDs. Further, IEDs may include sensors (e.g., voltage transformers, current transformers, contact sensors, status sensors, light sensors, tension sensors, etc.) that provide information about the electric power system.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. A module or component may comprise a single instruction or many instructions and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

FIG. 1 illustrates a block diagram of a system 100 for monitoring a transmission line 106 in an electric power system consistent with embodiments of the present disclosure. Transmission line 106 connects two nodes in the electric power system, which are illustrated as a first terminal 112 and a second terminal 114. First and second terminals 112 and 114 may be buses in a transmission system supplied by generators 116 and 118, respectively. Although illustrated in single-line form for purposes of simplicity, system 100 may be a multi-phase system, such as a three-phase electric power system.

System 100 is monitored by IEDs 102 and 104 at two locations of the system, although further IEDs may also be utilized to monitor additional locations of the system. IEDs 102 and 104 may obtain electric power system information using current transformers (CTs), potential transformers (PTs), Rogowski coils, voltage dividers, and/or the like. IEDs 102, 104 may be capable of using inputs from conventional instrument transformers such as CTs and PTs conventionally used in the monitoring of electric power delivery. IEDs 102 and 104 may also receive common time information from a common time source 110. In one specific embodiment, IEDs 102 and 104 may be embodied as SEL-T400L Time Domain Line Protection systems available from Schweitzer Engineering Laboratories ("SEL") of Pullman, Washington.

Common time source 110 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, voltages, currents, time-domain fault detection, and location. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like to communicate data.

IEDs 102 and 104 may provide various types of monitoring and protection by monitoring various electrical conditions in the time-domain, such as traveling wave detection, overcurrent protection, differential protection, and the like. IEDs 102 and 104 may measure electrical parameters at high speeds (e.g., 1 million samples per second). The measured electrical parameters may be stored for various purposes, such as post-event analysis, system analysis, event playback, testing, etc. Compressing the data generated by IEDs 102 and 104 may allow for a greater quantity of data to be stored in a given data storage device and may allow for such data to be more readily communicated for off-site use or analysis.

Figure 2A:
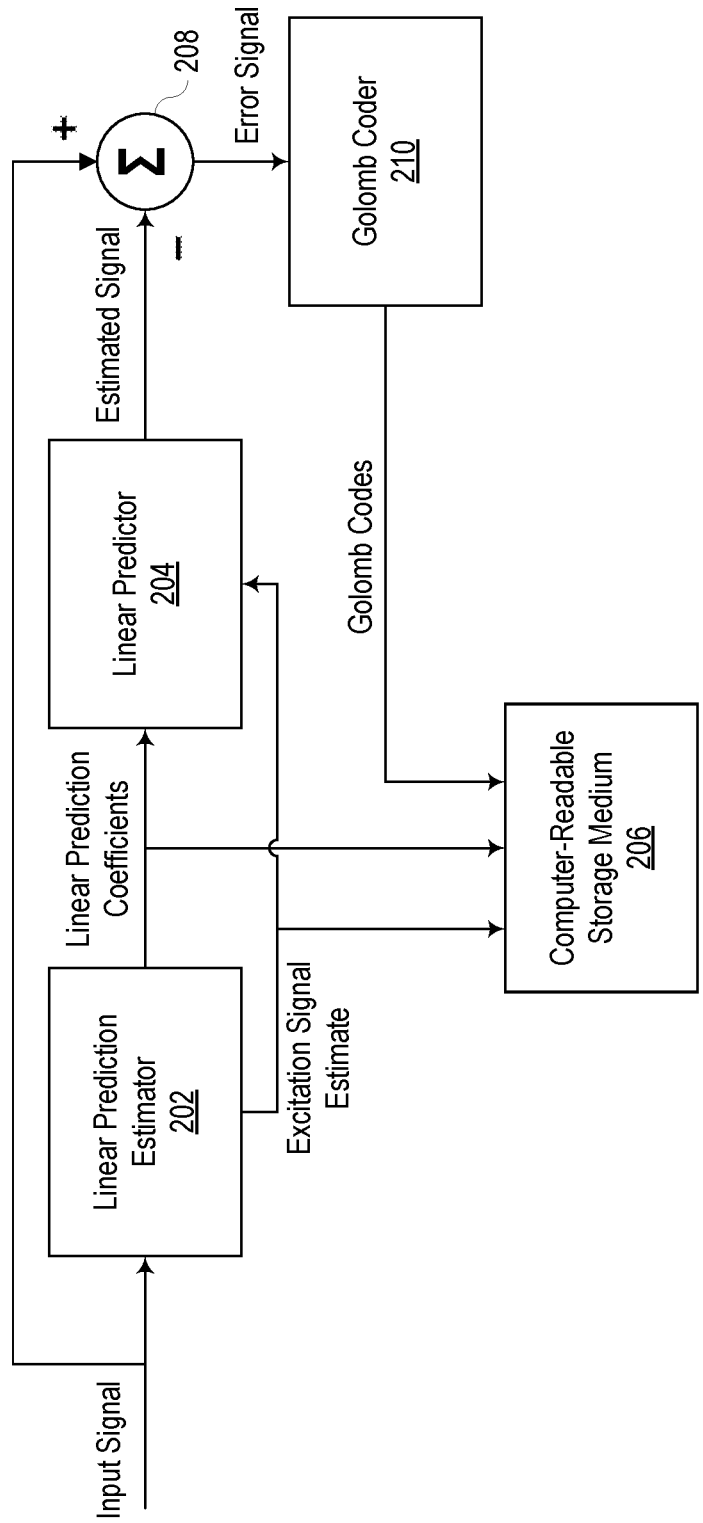
FIG. 2A illustrates a functional block diagram of a system to encode and compress power system signals using linear prediction and Golomb codes for storage on a computer-readable storage medium consistent with embodiments of the present disclosure.

FIG. 2A illustrates a functional block diagram of a system 200 to encode and compress power system signals using linear prediction and Golomb codes consistent with embodiments of the present disclosure. In one specific embodiment, IEDs 102 and 104 illustrated in FIG. 1, may comprise system 200 and may encode and compress data collected from the electric power system 100.

System 200 receives an input signal to be encoded and compressed. Although various embodiments specifically refer to electric power system data, other types of data may also be encoded and compressed by system 200. A linear prediction estimator 202 may receive the input signal, x(n), and generate a plurality of linear prediction coefficients, $a_i$. The linear prediction coefficients may be used to generate an estimated signal, x̂(n), using a linear function of previous samples, according to Eq. 1.

$$\hat{x}(n) = \Sum_{i=1}^{P} a_i x(n-i) \quad \text{Eq. 1}$$

The linear prediction coefficients are provided to a linear predictor 204 and a non-transitory computer-readable storage medium 206. Eq. 1 models the system as an all-pole filter and models the input signal as either a pitched (e.g., periodic) or unpitched (e.g., non-periodic, or the output of a stochastic system) signal.

Linear prediction estimator 202 may also generate an excitation signal estimate. The excitation signal estimate is typically determined by autocorrelation, although other frequency estimate techniques may be used. If the autocorrelation coefficients are of sufficient magnitude, the excitation signal is modeled as pitched, and estimates of magnitude, frequency, and phase may be calculated and stored; otherwise, it is modeled as unpitched, and variance and magnitude may be estimated and stored. The excitation signal estimate represents an abstract input to the model, used to regenerate an estimate of the input signal in a more compact representation.

Various strategies may be selected in different embodiments to optimize the value of $a_i$. For example, the root mean square or autocorrelation criteria may be used to minimize the value of the squared error. Other strategies, such as robust regressions (e.g., Student's t, Poisson, etc.) may also be utilized if the input signal is found to be non-normal or to contain significant outliers.

The linear predictor 204 may use Eq. 1 to generate an estimated signal. The estimated signal may not fully represent the input signal. The differences between the input signal and the estimated signal may be determined by summer 208, which generates an error signal, e(n), based on the difference between the input signal and the estimated signal, as expressed in Eq. 2.

$$e(n) = x(n) - \hat{x}(n) \quad \text{Eq. 2}$$

Capturing the error signal may allow for the estimated signal to be corrected to accurately represent the input signal. In a high-speed monitoring system, the error signal is likely to be close to zero. The function of summing the estimated signal and error signal may be performed by a general-purpose processor, a digital signal processor, or the like.

The error signal may be provided to Golomb coder 210. Golomb coding provides efficient coding of an input stream in which small values are more likely than large values. Golomb coding uses a tunable parameter, M, to divide an input value, N, into two parts: the quotient, q, and the remainder, r. In some embodiments, the quotient, q, may be encoded in unary coding, while the remainder, r, may be encoded using truncated binary coding. In other embodiments, including the specific embodiments described below, a variety of schemes may be used to encode the error signal.

Unary encoding represents a natural number, n, as a series of ones followed by a 0 (e.g., 0 is represented as 0, 1 is represented as 10, 2 is represented as 110, and 3 is represented as 1110) or a series of zeros followed by a 1 (e.g., 0 is represented as a 1, 1 is represented as 01, 2 is represented as 001, and 3 is represented as 0001). So long as the average number of bits used in unary encoding is less than the length of the machine representation natively, compression is achieved. For instance, for eight-bit values, if the average of the values being represented is less than seven, which requires eight bits in unary encoding, the values can be more compactly represented.

Truncated binary encoding more compactly represents a value x in an alphabet of size n, where $0 \leq x \leq n$. Let k=floor($\log_2(n)$) such that $2^k < n < 2^{k+1}$, and let $u = 2^{k+1} - n$. Then, assign the first u symbols to codewords of length k and the remaining n−u symbols to codewords of length k+1. If n is a power of two, truncated binary encoding is identical to normal binary encoding. For example, if n=5, then k=2 and u=3 and the truncated binary encoding is as shown below.

| Truncated Binary | Encoding | | |
|---|---|---|---|
| 0 | 0̶ | 0 | 0 |
| 1 | 0̶ | 0 | 1 |
| 2 | 0̶ | 1 | 0 |
| NA | 0̶ | 1̶ | 1̶ |
| NA | 1̶ | 0̶ | 0̶ |
| NA | 1̶ | 0̶ | 1̶ |
| 3 | 1 | 1 | 0 |
| 4 | 1 | 1 | 1 |

Values with a strike-through are not used in truncated binary encoding. Therefore, the value 0 is encoded as 00, 1 is encoded as 01, 2 is encoded as 10, 3 is encoded as 110, and 4 as 111.

System 200 may create an encoded and compressed representation of the input signal that requires significantly less space to store on computer-readable storage medium 206. In one embodiment, the input signal may comprise a one million samples per second signal in which each sample is represented by 18-bits of information. The encoded and compressed representation may represent the same information using between approximately 4 and 6 bits per sample. In other embodiments, a compression ratio (i.e., the size of the uncompressed data divided by the size of the compressed data) may be between 4 and 8.

Figure 2B:
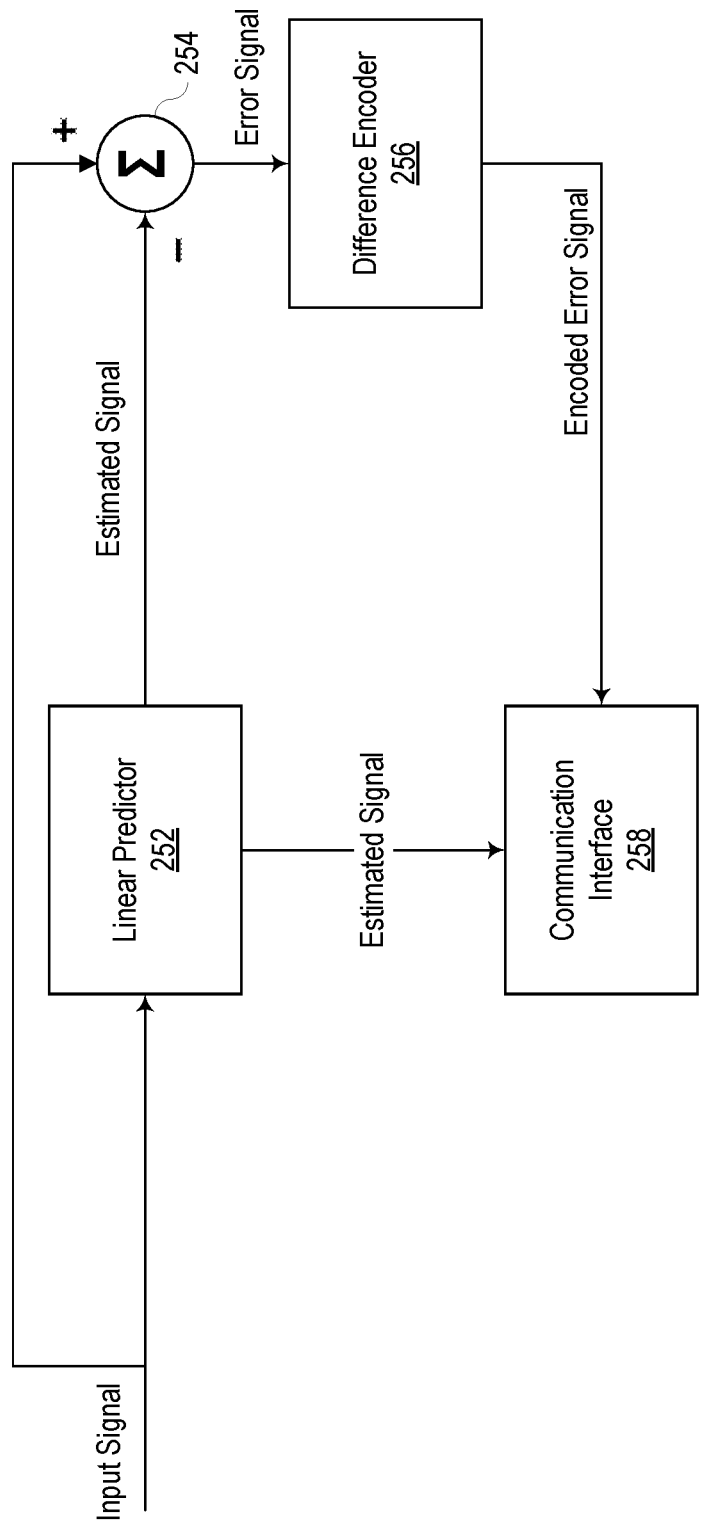
FIG. 2B illustrates a functional block diagram of a system to encode and compress power system signals using linear prediction and an encoding of an error signal for real-time encoding and transmission consistent with embodiments of the present disclosure.

FIG. 2B illustrates a functional block diagram of a system 250 to encode and compress power system signals using linear prediction and an encoding of the error signal for real-time encoding and transmission consistent with embodiments of the present disclosure. In real-time transmission, encoding of the input signal is a limiting factor, and as such, various techniques may be employed to increase encoding speed.

System 250 includes a linear predictor 252 that generates an estimated signal. In one specific embodiment, linear predictor 252 may be embodied as a fixed coefficient second-order linear predictor. Linear predictor 252 may generate an estimated signal that is provided to a communication interface 258 and a summer 254. In contrast to system 200 illustrated in FIG. 2A, system 250 does not include a linear prediction estimator that generates linear prediction coefficients; however, other embodiments may include a dynamic estimator or other device to generate an estimated signal.

An error signal may be generated by summer 254 and encoded by difference encoder 256. The estimated signal generated by linear predictor 252 may be compared to the input signal by summer 254 to generate the error signal. The error signal may be provided to difference encoder 256. Difference encoder 256 may use a variety of techniques to generate an encoded error signal. In one specific embodiment, the difference encoder 256 may use a "zigzag" encoding that maps negative numbers to positive numbers, as shown in the following table. As illustrated, the encoded value "zigzags" between negative and positive values.

| Signed Value | Encoded Value |
|---|---|
| 0 | 0 |
| −1 | 1 |
| 1 | 2 |
| −2 | 3 |

In another embodiment, a variable-length encoding scheme that maps integers into sequences of bytes of variable length may be used. If the value of the error signal is small, the average length of the integer value is less than a direct binary encoding. For example, for 18-bit data, the differences between the variable-length encoding and the actual signal could be as large as $\pm 2^{17}$ or $\pm 131,072$. If the average error signal value is less than $\pm 128$, the average variable-length representation would be 8 bits, which would represent a considerable reduction in comparison to a signal represented by a fixed length encoding (e.g., an 18-bit signal).

In yet another example, the difference encoder 256 may map integer values into a sequence of smaller pieces, referred to as "nibbles." If the average error value is less than $\pm 15$, the encoded error signal can be represented in "nibbles" of 4 bits. For larger error values, multiple "nibbles" may be used.

Communication interface 258 may receive the estimated signal from linear predictor 252 and the encoding of the error signal from difference encoder 256 to transmit a representation of the input signal. Communication interface 258 may be embodied by a variety of communication technologies. In one specific embodiment, system 250 may be embodied by an IED, and the input signal may represent electrical parameters to be streamed to a remote computer system.

Figure 3:
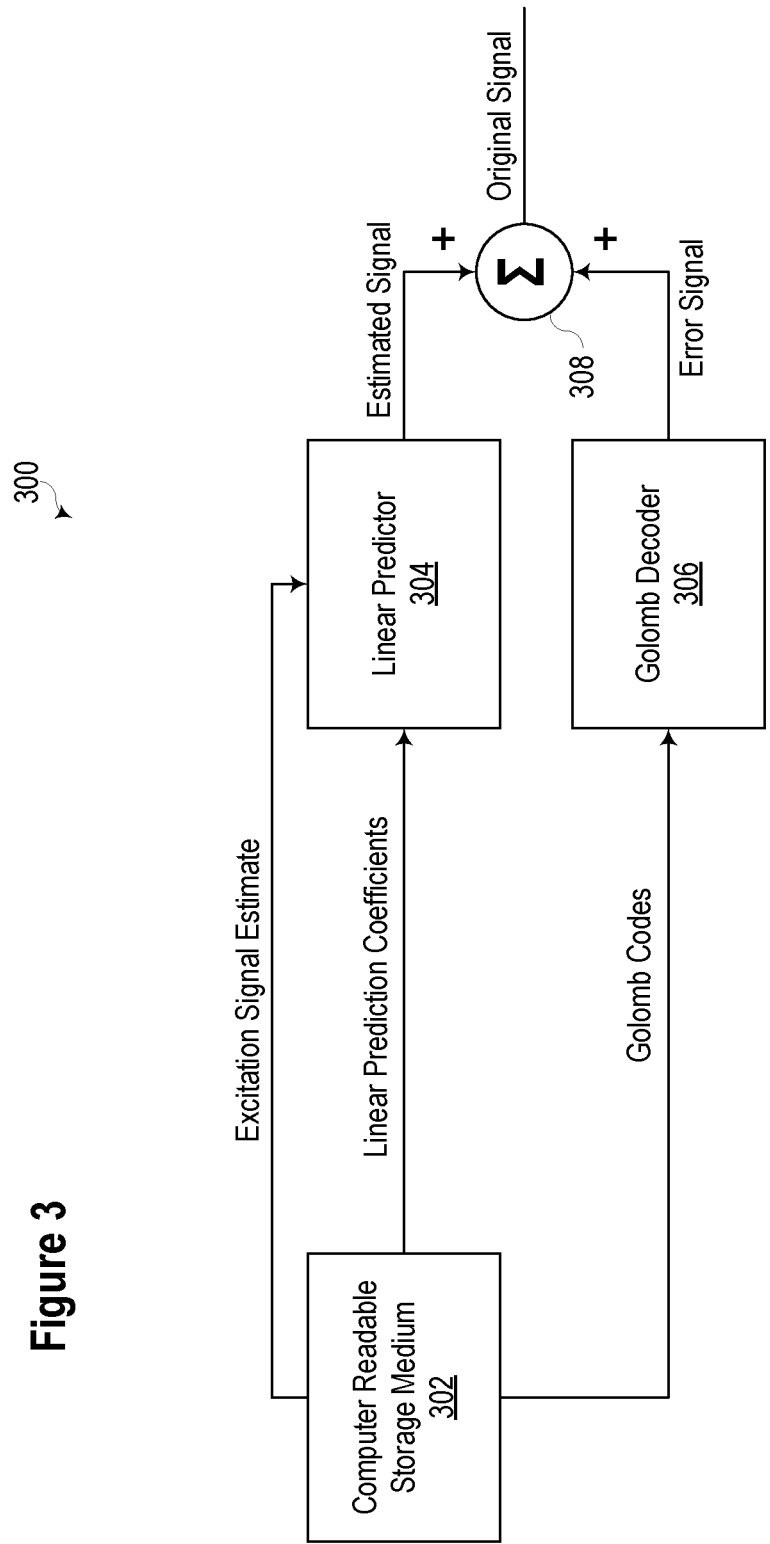
FIG. 3 illustrates a functional block diagram of a system to decode and decompress power system signals using linear prediction and Golomb codes consistent with embodiments of the present disclosure.

FIG. 3 illustrates a functional block diagram of a system 300 to decode and decompress power system signals stored using linear prediction and Golomb codes consistent with embodiments of the present disclosure. A signal to be decoded and decompressed is stored in non-transitory computer-readable storage medium 302. In one embodiment, the signal to be decoded may have been encoded and compressed by system 200 illustrated in FIG. 2A. In other embodiments, the signal to be decoded may be received from a communication interface receiving a streaming signal encoded by system 250 illustrated in FIG. 2B.

Non-transitory computer-readable storage medium 302 may include an excitation signal estimate, linear prediction coefficients, and Golomb codes. The excitation signal estimate and linear prediction coefficients may be provided to linear predictor 304. The excitation signal estimate and linear prediction coefficients may be used to generate an estimated signal that is provided to summer 308.

Non-transitory computer-readable storage medium 302 may also include Golomb codes representing an error signal. The error signal may be generated by Golomb decoder 306 and provided to summer 308. The sum of the estimated signal and the error signal may represent the original signal.

Figure 4:
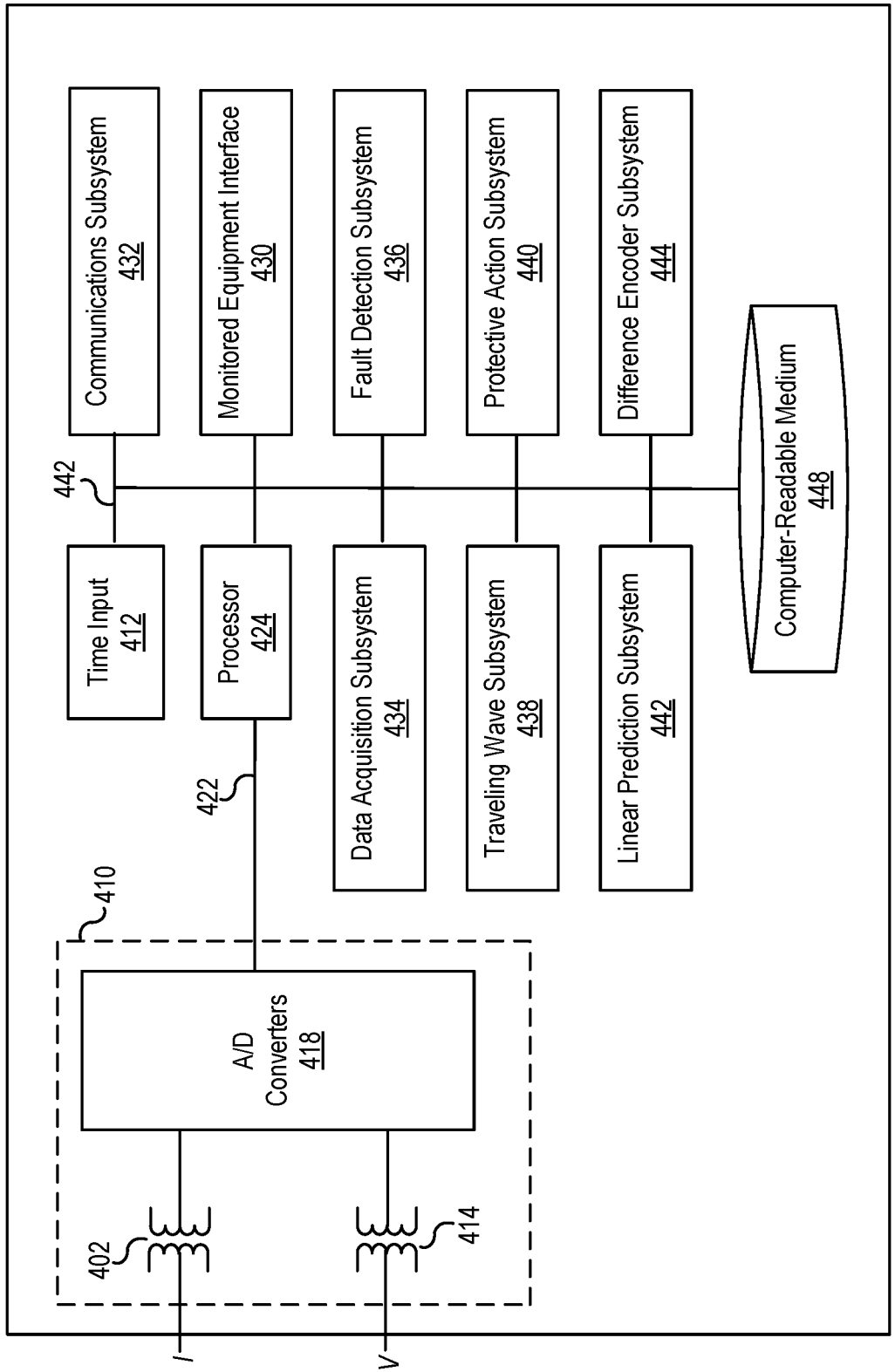
FIG. 4 illustrates a block diagram of a system to encode and decode compressed power system signals using linear prediction and an encoding of an error signal consistent with embodiments of the present disclosure.

FIG. 4 illustrates a functional block diagram of a system 400 to compress and decompress power system signals using linear prediction and Golomb codes consistent with embodiments of the present disclosure. System 400 may be implemented using hardware, software, firmware, and/or any combination thereof. In some embodiments, system 400 may be embodied as an IED, while in other embodiments, certain components or functions described herein may be associated with other devices or performed by other devices. The specifically illustrated configuration is merely representative of one embodiment consistent with the present disclosure.

System 400 includes a communication subsystem 432 to communicate with devices and/or IEDs. In certain embodiments, communication subsystem 432 may facilitate direct communication with other IEDs or communicate with systems over a communications network. Measurements relating to electrical conditions and other information used by system 400 may be transmitted via communication subsystem 432. Further, measurements and information created by system 400 may be transmitted via communication subsystem 432 to other components.

A monitored equipment interface 430 may receive status information from, and issue control instructions to, a piece of monitored equipment (such as a generator, transformer, circuit breaker, or the like). Monitored equipment interface 430 may implement control actions upon the detection of an over-excitation condition. Such instructions may include changing an excitation of a generator or a transformer or disconnecting a generator or a transformer.

Processor 424 processes communications received via communication subsystem 432, monitored equipment interface 430, and the other subsystems and components in system 400. Processor 424 may operate using any number of processing rates and architectures. Processor 424 may perform various algorithms and calculations described herein. Processor 424 may be embodied as a general-purpose integrated circuit, an application-specific integrated circuit, a field-programmable gate array, and/or any other suitable programmable logic device. Processor 424 may communicate with other elements in system 400 by way of bus 446.

Computer-readable medium 448 may comprise any of a variety of non-transitory computer-readable storage media. Computer-readable medium 448 may comprise executable instructions to perform processes described herein. Computer-readable medium 448 may comprise non-transitory machine-readable media such as, but is not limited to, hard drives, removable media, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. Such electronic instructions may be executed on processor 424.

A sensor subsystem 410 may receive current measurements (I) and/or voltage measurements (V)The sensor subsystem 410 may comprise A/D converters 418 that sample and/or digitize filtered waveforms to form corresponding digitized current and voltage signals provided to a data bus 422. A high-fidelity current transformer 402 and/or a high-fidelity voltage transformer 414 may include separate signals from each phase of a three-phase electric power system. A/D converters 418 may be connected to processor 424 by way of data bus 422, through which digitized representations of current and voltage signals may be transmitted to processor 424.

System 400 may further comprise a time input 412, which may be used to receive a time signal (e.g., a common time reference) allowing system 400 to apply a time-stamp to the acquired samples. In various embodiments, the common time reference may comprise a time signal derived from a GNSS. In certain embodiments, a common time reference may be received via communications subsystem 432, and accordingly, a separate time input 412 may not be required for time-stamping and/or synchronization operations. One such embodiment may employ the IEEE 1588 protocol.

Data acquisition subsystem 434 may collect data samples such as the current and voltage measurements. The data samples may be associated with a timestamp and made available for retrieval and/or transmission to a remote IED via communication subsystem 432. Data acquisition subsystem 434 may operate in conjunction with fault detection subsystem 436. Data acquisition subsystem 434 may control the recording of data used by the fault detection subsystem 436. According to one embodiment, data acquisition subsystem 434 may selectively store and retrieve data and may make the data available for further processing. Such processing may include processing by fault detection subsystem 436, which may be configured to determine the occurrence of a fault within an electric power distribution system.

Traveling wave subsystem 438 may operate in conjunction with data acquisition subsystem 434 to measure and record traveling waves in real-time since they are transient signals that dissipate rapidly in an electric power delivery system. Traveling waves may also be analyzed in conjunction with fault detection subsystem 436 to identify the occurrence of a fault and the location of the fault.

A protective action subsystem 440 may implement a protective action based on the identification of a fault by fault detection subsystem 436. In various embodiments, a protective action may include tripping a breaker, selectively isolating a portion of the electric power system, etc. Protective action subsystem 440 may coordinate protective actions with other devices in communication with system 400.

A linear prediction subsystem 442 may encode and compress data to be stored on computer-readable medium 448 and or decode and decompress data retrieved from computer-readable medium 448. Linear prediction subsystem 442 may generate an excitation signal estimate, linear prediction coefficients, and an estimated signal. In one specific embodiment, linear prediction subsystem 442 may embody linear prediction estimator 202 and linear predictor 204 illustrated in FIG. 2A and linear predictor 304 illustrated in FIG. 3.

A difference encoder subsystem 444 may provide efficient coding of an input stream representing an error between an input signal and an estimated signal generated by linear prediction subsystem 442. Further, difference encoder subsystem 444 may decode an encoding of the error signal stored on computer-readable medium 448. Alternatively, difference encoder subsystem 444 may decode an encoding of the error signal received via communications subsystem 432. In one specific embodiment, difference encoder subsystem 444 may embody Golomb coder 210 illustrated in FIG. 2A and Golomb decoder 306 illustrated in FIG. 3. In other embodiments, difference encoder subsystem 444 may be configured to encode the error signal using other techniques, including a zigzag encoding scheme and/or a variable-length encoding scheme.

In various embodiments, linear prediction subsystem 442 and difference encoder subsystem 444 may operate at speeds sufficient to support real-time encoding and compression of data collected by system 400. In one embodiment, system 400 may allow for encoding and compression of one million samples per second in addition to providing protection functionality.

Figure 5:
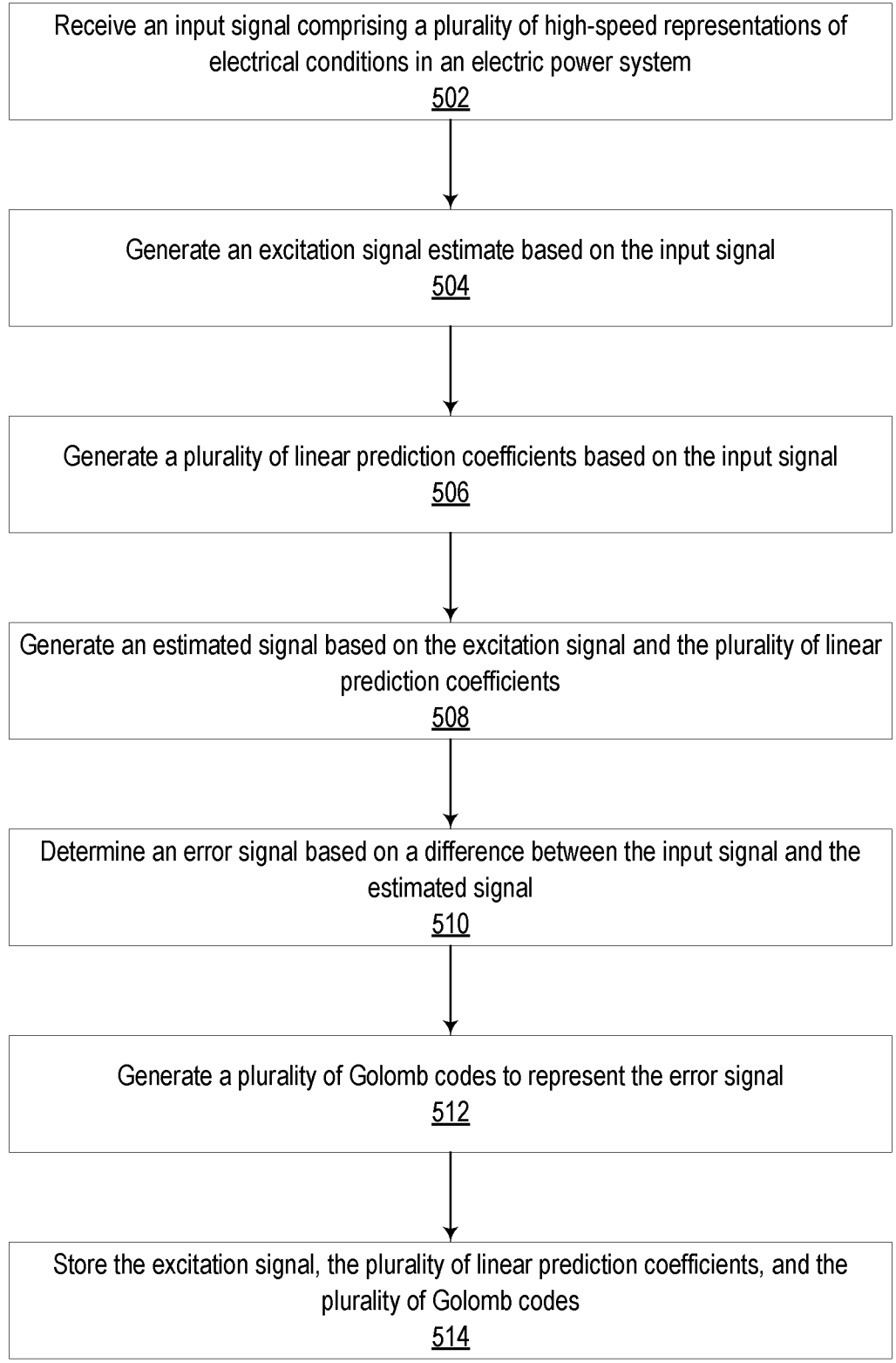
FIG. 5 illustrates a flow chart of a method to encode power system signals using linear prediction and Golomb codes consistent with embodiments of the present disclosure.

FIG. 5 illustrates a flow chart of a method 500 to encode power system signals using linear prediction and Golomb codes consistent with embodiments of the present disclosure. At 502, a system may receive an input signal comprising a plurality of high-speed representations of electrical conditions in an electric power system. Such conditions may be current measurements, voltage measurements, or other types of measurements.

At 504, an excitation signal estimate may be generated based on the input signal. The excitation signal estimate may be pitched or unpitched, depending on the results of a frequency estimation technique, such as autocorrelation.

At 506, a plurality of linear prediction coefficients may be generated based on the input signal. The linear prediction coefficients may represent the rate of change or slope of a portion of the input signal. In one specific embodiment, the excitation signal and the plurality of linear prediction coefficients may be generated by a linear prediction estimator, such as linear prediction estimator 202 illustrated in FIG. 2A.

At 508, an estimated signal may be generated based on the excitation signal and the plurality of linear prediction coefficients. A linear predictor, such as linear predictor 204 illustrated in FIG. 2A, may generate the estimated signal. In some embodiments, a linear prediction subsystem, such as linear prediction subsystem 442 illustrated in FIG. 4, may comprise a linear prediction estimator and a linear predictor.

At 510, an error signal may be determined based on a difference between the input signal and the estimated signal. The error signal may be determined by determining a difference between the input signal and the estimated signal. In one embodiment, the difference may be determined using summer 208 illustrated in FIG. 2A, or the error signal may be determined by a processor, such as processor 424 illustrated in FIG. 4.

At 512, a plurality of Golomb codes may be generated to represent the error signal. The plurality of Golomb codes may each comprise a quotient and a remainder determined by an error value divided by a tunable parameter. In some embodiments, the quotient is encoded using unary encoding and the remainder is encoded using truncated binary encoding.

At 514, the excitation signal, the plurality of linear prediction coefficients, and the plurality of Golomb codes may be stored on a computer-readable storage medium. In some embodiments, a compression ratio of the input signal and the encoded and compressed representation of the input signal is between approximately 4 and 8. The compression ratio may depend on various aspects of the input signal. In other embodiments, the compression ratio may be less than 4 or greater than 8.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to encode and compress an input signal representing a parameter in an electric power system using linear prediction and Golomb codes, comprising:
   a data acquisition subsystem to receive an input signal comprising a plurality of high-speed representations of electrical conditions associated with at least a portion of the electric power system;
   a linear prediction subsystem to generate:

an excitation signal estimate based on the input signal;
a plurality of linear prediction coefficients based on the input signal; and
an estimated signal based on the excitation signal estimate and the plurality of linear prediction coefficients;
a Golomb subsystem to generate a plurality of Golomb codes to represent an error signal based on a difference between the input signal and the estimated signal; and
a non-transitory computer-readable storage medium to store an encoded and compressed representation of the input signal comprising the excitation signal estimate, the plurality of linear prediction coefficients, and the plurality of Golomb codes.

2. The system of claim 1, wherein the input signal comprises about one million samples per second and the system is configured to encode and compress the input signal in real time.

3. The system of claim 1, wherein the system is further configured to decode and decompress the input signal stored on the non-transitory computer-readable storage medium.

4. The system of claim 1, further comprising a communication subsystem to transmit the encoded and compressed representation of the input signal.

5. The system of claim 1, wherein each of the plurality of Golomb codes comprises a quotient and a remainder determined by an error value divided by a tunable parameter.

6. The system of claim 5, wherein the quotient is encoded using unary encoding.

7. The system of claim 5, wherein the remainder is encoded using truncated binary encoding.

8. The system of claim 1, wherein a compression ratio of the input signal and the encoded and compressed representation of the input signal is between approximately 4 and 8.

9. The system of claim 1, further comprising a fault detection subsystem to detect a fault in the electric power system based on the input signal.

10. The system of claim 9, further comprising a protective action subsystem to implement a protective action based on detection of the fault.

11. A method of encoding and compressing an input signal representing a parameter in an electric power system using linear prediction and Golomb codes, comprising:
receiving, using a data acquisition subsystem, an input signal comprising a plurality of high-speed representations of electrical conditions associated with at least a portion of the electric power system;
generating, using a linear prediction subsystem, an excitation signal estimate based on the input signal;
generating, using the linear prediction subsystem, a plurality of linear prediction coefficients based on the input signal;
generating, using the linear prediction subsystem, an estimated signal based on the excitation signal estimate and the plurality of linear prediction coefficients;
generating, using a Golomb subsystem, a plurality of Golomb codes to represent an error signal based on a difference between the input signal and the estimated signal; and
storing, using a non-transitory computer-readable storage medium, an encoded and compressed representation of the input signal comprising the excitation signal estimate, the plurality of linear prediction coefficients, and the plurality of Golomb codes.

12. The method of claim 11, wherein the input signal comprises about one million samples per second and wherein encoding and compressing the input signal occurs in real time.

13. The method of claim 11, further comprising decoding and decompressing the input signal stored on the non-transitory computer-readable storage medium.

14. The method of claim 11, further comprising transmitting, using a communication subsystem, the encoded and compressed representation of the input signal.

15. The method of claim 11, wherein each of the plurality of Golomb codes comprises a quotient and a remainder determined by an error value divided by a tunable parameter.

16. The method of claim 15, further comprising encoding the quotient using unary encoding.

17. The method of claim 15, further comprising encoding the remainder using truncated binary encoding.

18. The method of claim 11, wherein a compression ratio of the input signal and the encoded and compressed representation of the input signal is between approximately 4 and 8.

19. The method of claim 11, further comprising detecting, using a fault detection subsystem, a fault in the electric power system based on the input signal.

20. The method of claim 19, further comprising implementing, using a protective action subsystem, a protective action based on detection of the fault.

21. A system to encode and compress an input signal in real time representing a parameter in an electric power system using linear prediction and an encoded error signal, comprising:
a data acquisition subsystem to receive an input signal comprising a plurality of high-speed representations of electrical conditions associated with at least a portion of the electric power system;
a linear prediction subsystem to generate a linear estimated signal using a plurality of fixed coefficients;
an error signal subsystem to generate an encoded error signal to represent an error between the input signal and the linear estimated signal; and
a communication interface to transmit the estimated signal and the encoded error signal to a receiving device.

22. The system of claim 21, wherein the error signal subsystem is configured to encode the encoded error signal using a zigzag encoding scheme.

23. The system of claim 21, wherein the error signal subsystem is configured to encode the encoded error signal using a variable-length encoding scheme.

* * * * *